(12) United States Patent
Kim et al.

(10) Patent No.: US 10,332,433 B2
(45) Date of Patent: *Jun. 25, 2019

(54) DISPLAY DEVICE

(71) Applicant: Samsung Display Co., Ltd., Yongin-si, Gyeonggi-do (KR)

(72) Inventors: Yang Wan Kim, Hwaseong-si (KR); Won Kyu Kwak, Seongnam-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/934,716

(22) Filed: Mar. 23, 2018

(65) Prior Publication Data
US 2018/0218658 A1  Aug. 2, 2018

Related U.S. Application Data

(63) Continuation of application No. 15/164,529, filed on May 25, 2016, now Pat. No. 9,928,768.

(30) Foreign Application Priority Data

May 26, 2015 (KR) .................. 10-2015-0073171

(51) Int. Cl.
*G09G 3/00* (2006.01)
*H01L 51/00* (2006.01)
(Continued)

(52) U.S. Cl.
CPC .......... *G09G 3/006* (2013.01); *G06F 3/0412* (2013.01); *G09G 3/2092* (2013.01);
(Continued)

(58) Field of Classification Search
CPC .......... G09G 3/006; G09G 3/2092; G09G 2300/08; G09G 2310/0202;
(Continued)

(56) References Cited

U.S. PATENT DOCUMENTS 5,196,799 A     3/1993 Beard et al.
9,928,768 B2 *  3/2018 Kim .............. G09G 3/2092
(Continued)

FOREIGN PATENT DOCUMENTS

CN    103996796 A    8/2014
EP    2 983 157 A1   2/2016
(Continued)

OTHER PUBLICATIONS

Extended European Search Report dated Sep. 14, 2016 for European Patent Application No. EP 16 171 465.4.
(Continued)

*Primary Examiner* — Stephen G Sherman
(74) *Attorney, Agent, or Firm* — F. Chau & Associates, LLC

(57) ABSTRACT

A display device is disclosed. In one aspect, the device includes a substrate including a display area and a non-display area surrounding the display area and a plurality of pixels formed in the display area. The device also includes a plurality of signal lines formed over the substrate and electrically connected to the pixels and an encapsulation layer formed over the substrate, wherein the signal lines include. The device further includes a plurality of gate lines and a plurality of data lines formed over the substrate and a first crack sensing line electrically connected to a first one of the data lines and overlapping the encapsulation layer in the depth dimension of the display device.

14 Claims, 11 Drawing Sheets

(51) Int. Cl.
*H01L 27/32* (2006.01)
*H01L 51/52* (2006.01)
*G06F 3/041* (2006.01)
*G09G 3/20* (2006.01)

(52) U.S. Cl.
CPC ...... *H01L 27/3276* (2013.01); *H01L 51/0031* (2013.01); *H01L 51/5253* (2013.01); *G06F 2203/04106* (2013.01); *G09G 2300/08* (2013.01); *G09G 2310/0202* (2013.01); *G09G 2310/0232* (2013.01); *G09G 2330/028* (2013.01); *G09G 2330/12* (2013.01)

(58) Field of Classification Search
CPC ..... G09G 2310/0232; G09G 2330/028; G09G 2330/12; G06F 3/0412; G06F 2203/04106; H01L 27/3276; H01L 51/0031; H01L 51/5253
See application file for complete search history.

(56) References Cited

U.S. PATENT DOCUMENTS

| | | |
|---|---|---|
| 2014/0176844 A1 | 6/2014 | Yanagisawa |
| 2014/0183522 A1 | 7/2014 | Cha et al. |
| 2014/0368228 A1 | 12/2014 | Kim |
| 2015/0060819 A1 | 3/2015 | Toshihiro et al. |
| 2016/0043010 A1 | 2/2016 | Kwak et al. |
| 2016/0307971 A1 | 10/2016 | Jeon |
| 2016/0351093 A1 | 12/2016 | Kim |

FOREIGN PATENT DOCUMENTS

| | | |
|---|---|---|
| JP | 2009-277549 A | 11/2009 |
| JP | 2014-021479 A | 2/2014 |
| KR | 10-2014-0103518 A | 8/2014 |

OTHER PUBLICATIONS

European Examination Report dated Sep. 14, 2017 for European Patent Application No. EP 16 171 465.4.

* cited by examiner

DISPLAY DEVICE

CROSS-REFERENCE TO RELATED APPLICATION

Any and all priority claims identified in the Application Data Sheet, or any correction thereto, are hereby incorporated by reference under 37 CFR 1.57. For example, this application is a continuation of U.S. patent application Ser. No. 15/164,529, filed May 25, 2016, which claims priority to and the benefit of Korean Patent Application No. 10-2015-0073171 filed in the Korean Intellectual Property Office on May 26, 2015, the entire contents of which are incorporated herein by reference.

BACKGROUND

Field

The described technology generally relates to a display device.

Description of the Related Technology

As portable display devices gain in popularity, there is even more rapid growth in demand for flexible display devices.

When substrate cracks are generated during manufacturing, moisture can permeate through the entire display area. This causes degradation and ultimately failure. Thus, it is very important to precisely detect when and where cracks have formed.

As an example, cracks can be generated along an edge of a thin film layer which covers a display area as well as a non-display area that surrounds the display area.

The above information disclosed in this Background section is only for enhancement of understanding of the background of the described technology and therefore it can contain information that does not constitute the prior art that is already known in this country to a person of ordinary skill in the art.

SUMMARY

One inventive aspect relates to a display device which can prevent deterioration of the display device caused by cracks that generated at a portion of an edge of a thin film layer which covers a display area as well as a non-display area that is an edge of the display device, by easily detecting the cracks.

Another aspect is a display device that includes: a substrate configured to include a display area and a non-display area formed in a peripheral area of the display area; a plurality of pixels formed in the display area of the substrate; a plurality of signal lines formed in the substrate and connected to the pixels; and an encapsulation portion formed on the substrate, wherein the a plurality of signal lines includes: a plurality of gate lines and a plurality of data lines formed on the substrate, and a first crack sensing lines connected to a first one of the of data lines and formed at a portion to overlap the encapsulation portion.

The encapsulation portion can be formed in the display area and the non-display area, and the first crack sensing line can be formed in the non-display area.

The display device can further include a touch portion formed on the encapsulation portion, and the first crack sensing line can be formed at a same layer as that of a touch wire of the touch portion.

The signal lines can further include a first signal line and a second signal line formed in the non-display area of the substrate, the first crack sensing line can be connected to the first data line and travels along one edge of the display area in a half-ring shape, and the data lines can be connected to the first signal line through a first transistor and are connected to the second signal line through a second transistor.

The first crack sensing line can be connected between the second signal line and the second transistor.

The display device can further include a first gate line formed in the non-display area of the substrate and connected to the first transistor; and a second gate line connected to the second transistor. When a first gate-on voltage is supplied to the first gate line, the data lines can receive a first signal from the first signal line, and when a second gate-on voltage is applied to the second gate line, the data lines can receive a second signal from the second signal line.

The second gate-on voltage can be applied after the first gate-on voltage is applied, and the first signal and the second signal can have different signals.

The display device can further include a second crack sensing line connected to a second one of the data lines, formed to not overlap the encapsulation portion, and formed in the non-display area.

The second crack sensing line can be formed at a same layer as that of the gate lines.

The display device can further include an insulating layer formed between the second crack sensing line and the gate lines to have a contact hole for exposing a portion of the second crack sensing line, and the second crack sensing line can be connected to the second data line through the contact hole.

The second crack sensing line can be formed at a same layer as that of the gate lines.

The signal lines can further includes a first signal line and a second signal line formed in the non-display area of the substrate, and the first crack sensing line can be connected to the first data line and travels along one edge of the display area in a half-ring shape, and the second crack sensing line can travel along the edge of the display area in parallel with the first crack sensing line in the half-ring shape, and the data lines can be connected to the first signal line through a first transistor and is connected to the second signal line through a second transistor.

The first crack sensing line can be connected between the second signal line and the second transistor, and the second crack sensing line can be connected between the second signal line and the second transistor.

Another aspect is a display device, comprising: a substrate including a display area and a non-display area surrounding the display area; a plurality of pixels formed in the display area; a plurality of signal lines formed over the substrate and electrically connected to the pixels; and an encapsulation layer formed over the substrate, wherein the signal lines include: a plurality of gate lines and a plurality of data lines formed over the substrate, and a first crack sensing line electrically connected to a first one of the data lines and overlapping the encapsulation layer in the depth dimension of the display device.

In the above display device, the encapsulation layer is formed in the display area and the non-display area, and wherein the first crack sensing line is formed in the non-display area. The above display device further comprises a touch layer including a touch wire and formed over the encapsulation portion, wherein the first crack sensing line is formed on the same layer as the touch wire of the touch layer. In the above display device, the signal lines further include a first signal line and a second signal line formed in the non-display area, wherein the first crack sensing line is electrically connected to the first data line and extends along an edge of the display area substantially in a semi-circular shape, and wherein the data lines are electrically connected to the first signal line via a first transistor and the second signal line via a second transistor.

In the above display device, the first crack sensing line is electrically connected to the second signal line and the second transistor. The above display device further comprises: a first gate line formed in the non-display area and electrically connected to the first transistor; and a second gate line electrically connected to the second transistor, wherein the data lines are configured to receive a first signal from the first signal line based on a first gate-on voltage applied to the first gate line, and wherein the data lines are configured to receive a second signal from the second signal line based on a second gate-on voltage applied to the second gate line. In the above display device, the second gate-on voltage is configured to be applied after the first gate-on voltage is applied, and wherein the first and second signals are different.

The above display device further comprises a second crack sensing line electrically connected to a second one of the data lines, wherein the second crack sensing line is formed in the non-display area and does not overlap the encapsulation layer in the depth dimension of the display device. In the above display device, the second crack sensing line is formed on the same layer as the gate lines. The above display device further comprises an insulating layer having a contact hole and interposed between the second crack sensing line and the gate lines, wherein the second crack sensing line is connected to the second data line via the contact hole.

In the above display device, the signal lines further include a first signal line and a second signal line formed in the non-display area, wherein the first crack sensing line is electrically connected to the first data line and extends along an edge of the display area substantially in a semi-circle shape, wherein the second crack sensing line extends along the edge of the display area substantially in parallel with the first crack sensing line, and wherein the data lines is electrically connected to the first signal line via a first transistor and the second signal line via a second transistor. In the above display device, the first crack sensing line is electrically connected to the second signal line and the second transistor, and wherein the second crack sensing line is electrically connected to the second signal line and the second transistor.

The above display device further comprises: a first gate line formed in the non-display area and electrically connected to the first transistor; and a second gate line electrically connected to the second transistor, wherein the data lines are configured to receive a first signal from the first signal line based on a first gate-on voltage applied to the first gate line, and wherein the data lines are configured to receive a second signal from the second signal line based on a second gate-on voltage applied to the second gate line. In the above display device, the second gate-on voltage is configured to be applied after the first gate-on voltage is applied, and wherein the first and second signals are different.

In the above display device, the second crack sensing line is formed on the same layer as the gate lines. In the above display device, the signal lines further include a first signal line and a second signal line formed in the non-display area of the substrate, wherein the first crack sensing line is electrically connected to the first data line and extends along an edge of the display area in a semi-circular shape, wherein the second crack sensing line extends along the edge of the display area substantially in parallel with the first crack sensing line, and wherein the data lines is electrically connected to the first signal line via a first transistor and the second signal line via a second transistor. In the above display device, the first crack sensing line is electrically connected to the second signal line and the second transistor, and wherein the second crack sensing line is electrically connected to the second signal line and the second transistor.

The above display device further comprises: a first gate line formed in the non-display area of the substrate and electrically connected to the first transistor; and a second gate line electrically connected to the second transistor, wherein the data lines are configured to receive a first signal from the first signal line based on a first gate-on voltage applied to the first gate line, and wherein the data lines are configured to receive a second signal from the second signal line based on a second gate-on voltage applied to the second gate line. In the above display device, the second gate-on voltage is configured to be applied after the first gate-on voltage is applied, and wherein the first and second signals include different signals. The above display device further comprises a touch layer including a touch wire and formed over the encapsulation layer, wherein the first crack sensing line is formed in the same layer as the touch wire.

Another aspect is a display device, comprising: a substrate including a display area and a non-display area surrounding the display area; a plurality of pixels formed in the display area; an encapsulation layer formed over the substrate; a plurality of data lines formed over the substrate; and a first crack sensing line formed in the non-display area and electrically connected to a first one of the data lines, wherein the first crack sensing line overlaps the encapsulation layer in the depth dimension of the display device.

The above display device further comprises a second crack sensing line electrically connected to a second one of the data lines, wherein the second crack sensing line is formed in the non-display area and does not overlap the encapsulation layer in the depth dimension of the display device. In the above display device, the second crack sensing line is farther from the first crack sensing line than the encapsulation layer.

According to at least one of the disclosed embodiments, it is possible to easily detect cracks of thin film layers which cover the display area as well as the edge of the display device to prevent deterioration of the display device.

DETAILED DESCRIPTION

Figure 1:
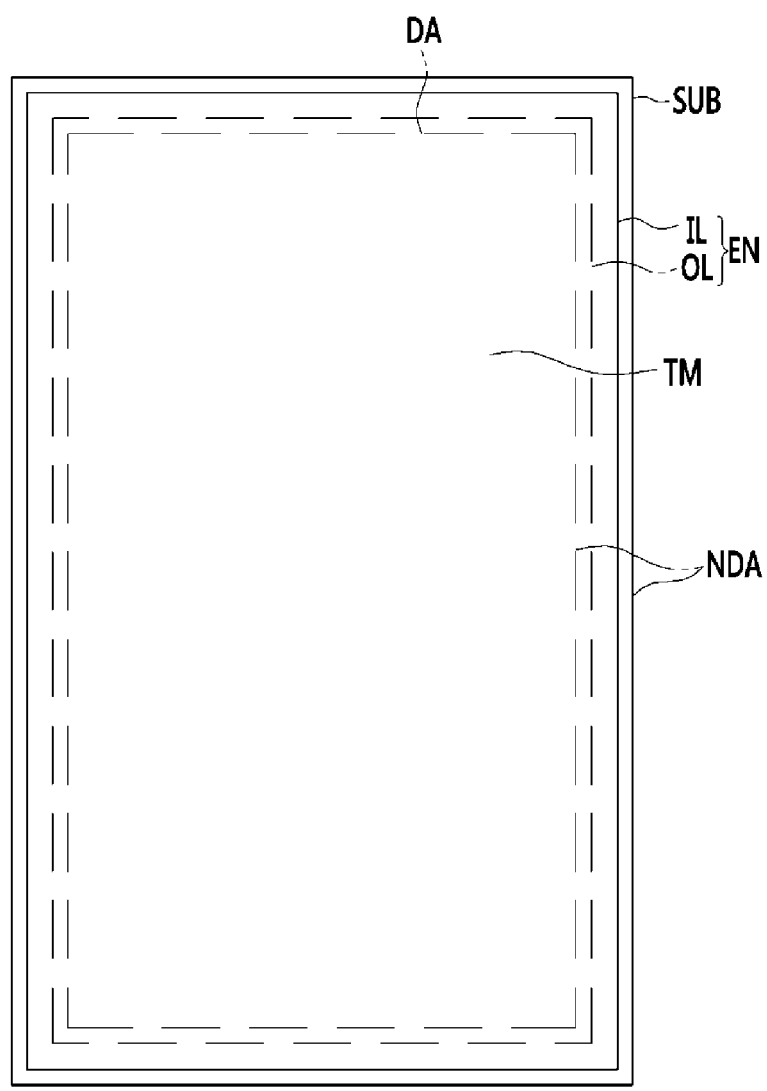
FIG. 1 is a top plan view of a display device according to an exemplary embodiment.

The described technology will be described more fully hereinafter with reference to the accompanying drawings, in which exemplary embodiments of the described technology are shown. As those skilled in the art would realize, the described embodiments can be modified in various different ways, all without departing from the spirit or scope of the described technology.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements can also be present. In contrast, when an element is referred to as being "directly on" another element, there are no intervening elements present. In this disclosure, the term "substantially" includes the meanings of completely, almost completely or to any significant degree under some applications and in accordance with those skilled in the art. Moreover, "formed on" can also mean "formed over." The term "connected" can include an electrical connection.

First, a display device according to an exemplary embodiment will be described with reference to FIG. 1

FIG. 1 is a top plan view of a display device according to an exemplary embodiment.

Referring to FIG. 1, the display device according to the present exemplary embodiment includes a substrate SUB, an encapsulation portion EN, and a touch portion TM.

The substrate SUB is an insulating substrate including glass, a polymer, or stainless steel. The substrate SUB can be flexible, stretchable, foldable, bendable, or rollable. Since the substrate SUB is flexible, stretchable, foldable, bendable, or rollable, the display device can be wholly flexible, stretchable, foldable, bendable, or rollable. For example, the substrate SUB is formed as a flexible film including a resin such as a polyimide and the like.

The substrate SUB includes a display area DA for displaying an image and a non-display area NDA formed to surround the display area DA. Although the non-display area NDA has been described to surround the display area DA In the present exemplary embodiment, the non-display area NDA can be formed at opposite sides of the display area DA in a display device according to another exemplary embodiment, The display area DA of the substrate SUB includes a plurality of pixels. One pixel is a minimum unit for displaying an image.

The encapsulation portion EN is formed on the substrate SUB throughout the display area DA and the non-display area NDA, and encapsulates the pixels of the display area DA together with the substrate SUB. The encapsulation portion EN can be formed as a thin film encapsulation portion. The encapsulation portion EN includes an organic layer OL formed on the display area DA and an inorganic layer IL formed on the organic layer OL. The encapsulation portion EN according to another exemplary embodiment can include one or more organic layers and one or more inorganic layers that are alternately stacked. For example, the inorganic layer and the organic layer respectively include a plurality of inorganic layers and a plurality of organic layers, and the inorganic layers and the organic layers can respectively be alternately stacked. For example, the encapsulation portion EN includes at least one sandwich structure in which at least one organic layer is inserted between at least two inorganic layers.

Figure 2:
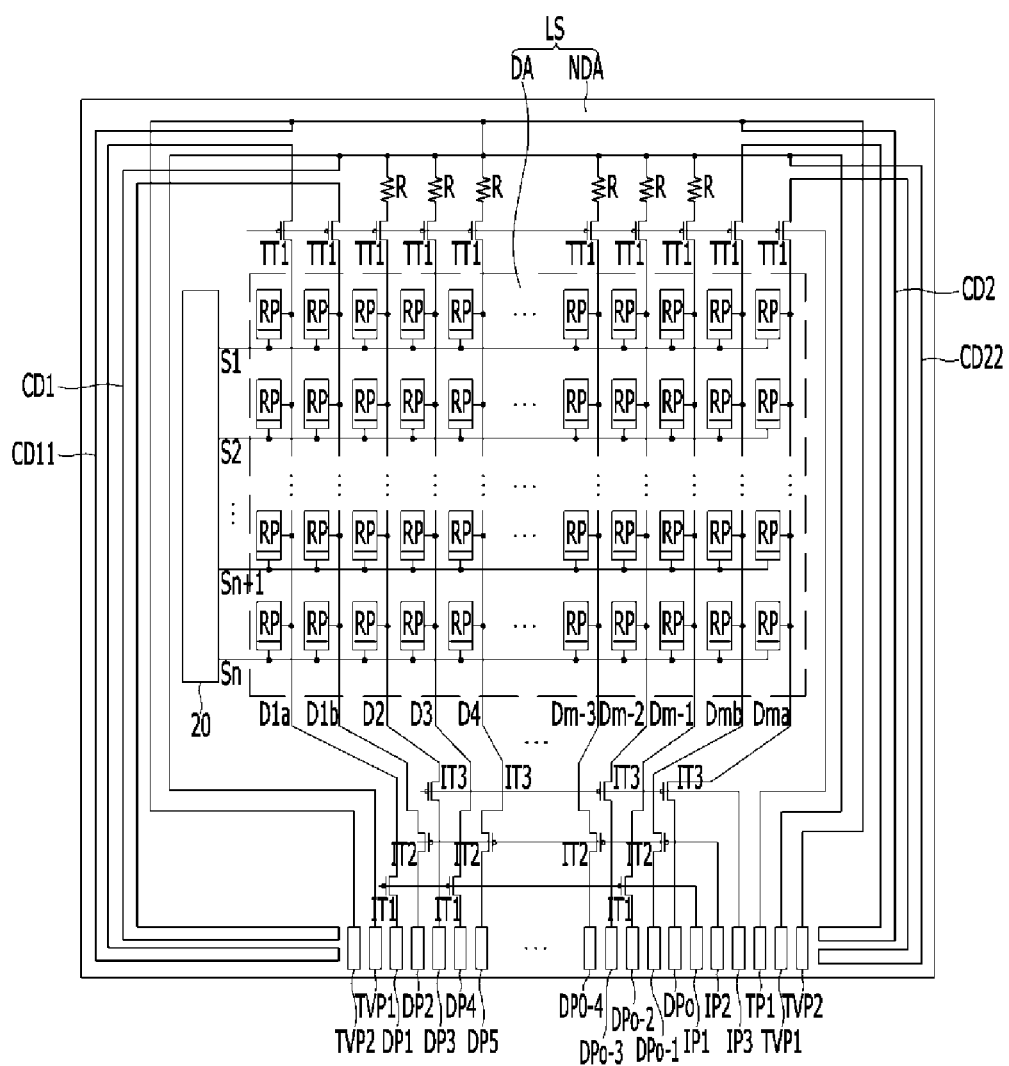
FIG. 2 is a circuit diagram of a display device according to an exemplary embodiment.

Hereinafter, the disposition of a display device according to an exemplary embodiment will be described with reference to FIG. 1 and FIG. 2. FIG. 2 is a circuit diagram of a display device according to an exemplary embodiment.

Referring to FIG. 1 and FIG. 2, the display device according to the present exemplary embodiment includes a display area DA in which a plurality of pixels P are formed and a non-display area NDA formed around the display area.

The display device according to the exemplary embodiment includes a plurality of pixels P formed on the substrate SUB, and a plurality of signal lines, the pixels P are formed in the display area DA of the, and at least a portion of the signal lines is formed on the non-display area NDA of the substrate SUB.

The signal lines include gate lines S1-Sn and data lines D1a-Dma formed in the display area DA of the substrate SUB, and first crack sensing line CD1, second crack sensing line CD2, third crack sensing line CD11 and fourth crack sensing line CD22 formed in the non-display area NDA of the substrate SUB.

The first crack sensing line CD1 and second crack sensing line CD2 are formed on the same layer as that of touch wires formed at the touch portion TM. The first crack sensing line CD1 and second crack sensing line CD2 are formed on the encapsulation portion EN. The third crack sensing line CD11 and fourth crack sensing line CD22 are formed on the same layer as a portion of the signal signals, e.g., gate wires or data wires. The third crack sensing line CD11 and fourth crack sensing line CD22 are formed in the display area DA and at an edge of the substrate SUB that does not overlap the encapsulation portion EN.

The non-display area NDA in which the first crack sensing line CD1, the second crack sensing line CD2, the third crack sensing line CD11, and the fourth crack sensing line CD22 can be bent.

Data pads DP1-DPo, initialization control pads IP1, IP2, and IP3, first test control pad TP1, test voltage pads TVP1 and TVP2, initializing transistors IT1, IT2, and IT3, test transistors TT1 and resistors R are formed in the non-display area NDA of the substrate SUB. Herein, "o" indicates a positive integer which is greater than m.

The data pads DP1-DPo are connected to the data lines D1a-Dma through the initializing transistors IT1, IT2, and IT3. In the beginning, initializing voltages can be supplied to the data pads DP1-DPo.

Although not illustrated, the display device can further include a source drive IC. In this case, the data pads DP1-DPo are connected to the source drive IC. Specifically, the source drive IC can supply data voltages to the data pads DP1-DPo such that the data voltages to the data lines D1a-Dma of the display device.

In the illustrated exemplary embodiment, initialization control pads IP1, IP2, and IP3 and initializing transistors IT1, IT2, and IT3 are formed. In this case, the first initialization control pad IP1 can be connected to control electrodes of the first initializing transistors IT1, the second initialization control pad IP2 can be connected to control electrodes of the second initializing transistors IT2, and the third initialization control pad IP3 can be connected to control electrodes of the third initializing transistors IT3. A first initialization signal, a second initialization signal, and a third initialization signal can be respectively supplied to the first initialization control pad IP1, the second initialization control pad IP2, and the third initialization control pad IP3.

The first test control pad TP1 is connected to each control electrode of the test transistors TT1. A test control signal is supplied to the first test control pad TP1.

Test voltage pads TVP1 and TVP2 are connected to first electrodes of the test transistors TT1. A test voltage is supplied to the test voltage pads TVP1 and TVP2. The same test voltage or different test voltages can be supplied to the first and second test voltage pads TVP1 and TVP2. For example, a first test voltage is supplied to the first test voltage pad TVP1, and a second test voltage is supplied to the second test voltage pad. In this regard, the first test voltage can be the same as or different from the second test voltage.

The initializing transistors IT1, IT2, and IT3 are connected between the data lines D1a-Dma and the data pads DP1-DPo. Control electrodes of the first initializing transistors IT1 can be connected to the first initialization control pad IP1, control electrodes of the second initializing transistors IT2 can be connected to the first initialization control pad IP2, and control electrodes of the third initializing transistor IT3 can be connected to the third initialization control pad IP3.

For example, the control electrode of each of the first initializing transistors IT1 is connected to the first initialization control pad IP1, the first electrode thereof is connected to a corresponding one of the data lines D1a-Dma, and the second electrode thereof is connected to a corresponding one of the data pads DP1-DPo. The control electrode of each of the second initializing transistors IT2 can be connected to the second initialization control pad IP2, the first electrode thereof can be connected to a corresponding one of the data lines D1a-Dma, and the second electrode thereof can be connected to a corresponding one of the data pads DP1-DPo. The control electrode of each of the third initializing transistors IT3 can be connected to the third initialization control pad IP3, the first electrode thereof can be connected to a corresponding one of the data lines D1a-Dma, and the second electrode thereof can be connected to a corresponding one of the data pads DP1-DPo.

The test transistors TT1 can be connected between the data lines D1a-Dma and the test voltage pads TVP1 and TVP2. The control electrodes of the test transistors TT1 are connected to the first test control pad TP1. For example, the control electrode of each of the test transistors TT1 is connected to the first test control pad TP1, the first electrode is connected to a corresponding one of the test voltage pads TVP1 and TVP2, and the second electrode is connected to a corresponding one of the data lines D1a-Dma.

A crack sensing line can be formed between the test voltage pad and the first electrode of the test transistor TT1.

The first crack sensing line CD1 is formed between the first test voltage pad TVP1 and the first electrode of the test transistor TT1 connected to the first data line D1b, and the second crack sensing line CD2 is formed between the second test voltage pad TVP2 and the first electrode connected to the test transistor TT1 connected to the second data line Dmb. The third crack sensing line CD11 is formed between the second test voltage pad TVP2 and the first electrode of the test transistor TT1 connected to the third data line D1a, and the fourth crack sensing line CD22 is formed between the first test voltage pad TVP1 and the first electrode of the test transistor TT1 connected to the fourth data line Dma.

The first crack sensing line CD1, the second crack sensing line CD2, the third crack sensing line CD11, and the fourth crack sensing line CD22 can be formed in the non-display area NDA that is formed on an external side of the display area DA. For example, the first crack sensing line CD1 and the third crack sensing line CD11 are formed on an external left side of the display area DA, and the second crack sensing line CD2 and the fourth crack sensing line CD22 are formed on an external right side of the display area DA. Further, when the gate driver (not shown) is formed in the non-display area NDA formed at an external side of the display area DA, the first crack sensing line CD1, the second crack sensing line CD2, the third crack sensing line CD11, and the fourth crack sensing line CD22 can be formed on more external side than the gate driver.

Each of the first crack sensing line CD1, the second crack sensing line CD2, the third crack sensing line CD11, and the fourth crack sensing line CD22 can be formed to travel around the external side of the display area DA.

The first crack sensing line CD1 and the third crack sensing line CD11 can be formed to travel around the external left side of the display area DA, and the second crack sensing line CD2 and the fourth crack sensing line CD22 can be formed to travel around the external right side of the display area DA.

Resistors R can be formed between the test voltage pads TVP1 and TVP2 and the first electrodes of the test transistors TT1 which are not connected to the first crack sensing line CD1, the second crack sensing line CD2, the third crack sensing line CD11, and the fourth crack sensing line CD22. By the action of the resistors R, it is possible to compensate a test voltage difference according to wire resistance of the first crack sensing line CD1, the second crack sensing line CD2, the third crack sensing line CD11, and the fourth crack sensing line CD22.

In the illustrated exemplary embodiment, the test transistors TT1 and the resistors R are illustrated to be formed at an upper portion of the non-display area NDA. The data pads DP1-DPo, the initialization control pads IP1, IP2, and IP3, the first test control pad TP1, the test voltage pads TVP1 and TVP2, and the initializing transistors IT1, IT2, and IT3 are illustrated to be formed at a lower portion of the non-display area NDA. However, the dispositions of pad units, transistors, and signal lines of the non-display area NDA are not limited thereto.

Figure 3:
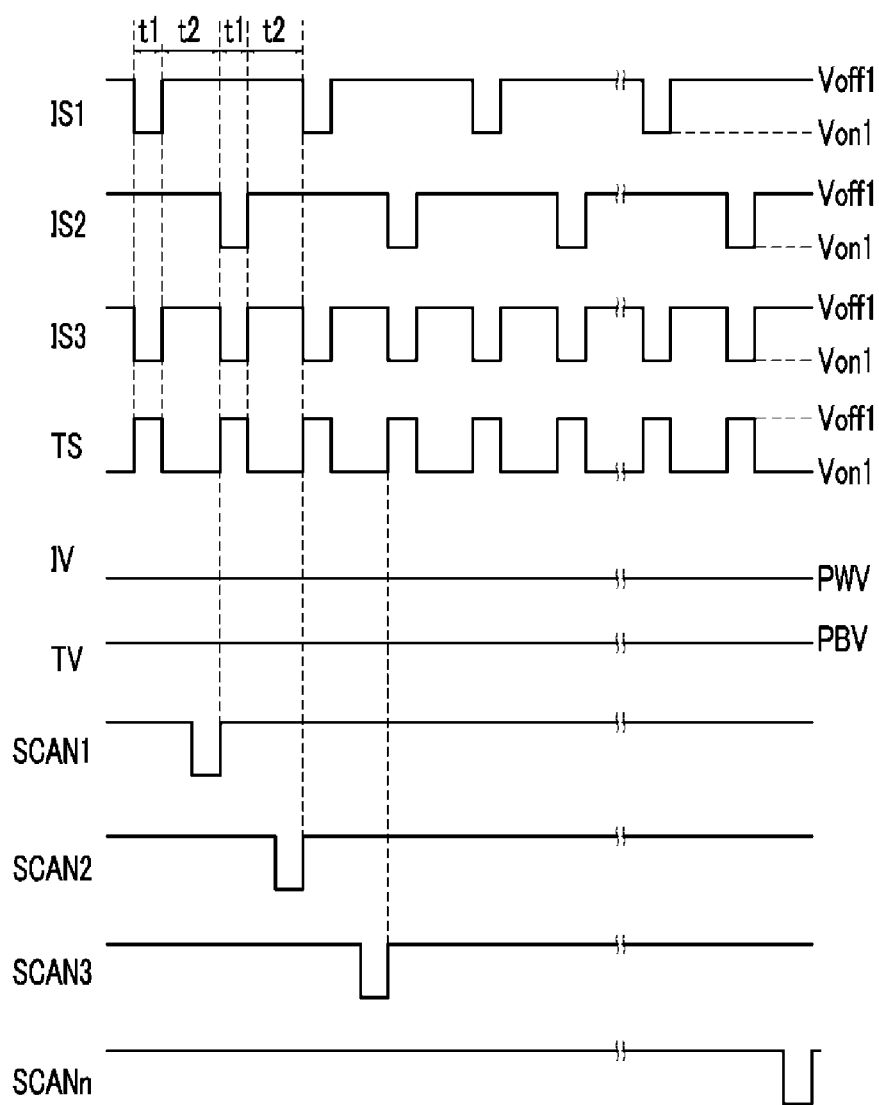
FIG. 3 is a waveform diagram illustrating signals of a display device according to an exemplary embodiment.

Hereinafter, signals supplied to the display device will be described with reference to FIG. 3. FIG. 3 is a waveform diagram illustrating signals of a display device according to an exemplary embodiment.

In FIG. 3, it is illustrated that initialization signals IS1, IS2, and IS3 supplied to the initialization control pads IP1, IP2, and IP3, a test control signal TS supplied to the first test control pad TP1, an initialization voltage IV supplied to the data pads DP1-DPo, a test voltage TV supplied to the test voltage pads TVP1 and TVP2, and first to third and $n^{th}$ scanning signals SCAN1, SCAN2, SCAN3, and SCANn.

Referring to FIG. 3, one frame period includes a plurality of horizontal periods, and one horizontal period includes a first period t1 and the second period t2. One frame period indicates a period during which data voltages are supplied to all the pixels of the display panel 10, and one horizontal period indicates a period during which data voltage is supplied to the pixels connected to one scanning line.

The first initialization signal IS1 is formed with a first gate-on voltage Von1 during the first period t1 of an odd-numbered horizontal period oh, and is formed with a first gate-off voltage Voff1 during the second period t2 of the odd-numbered horizontal period oh and an even-numbered horizontal period eh. The second initialization signal IS2 is formed with the first gate-on voltage Von1 during a first period t1 of the even-numbered horizontal period, and is formed with the first gate-off voltage Voff1 during the odd-numbered horizontal period oh and a second period t2 of the even-numbered horizontal period eh. The third initialization signal IS3 is formed with the first gate-on voltage Von1 during the first period t1 of every horizontal period, and is formed with the first gate-off voltage Voff1 during the second period t2.

The test control signal TS is formed with the first gate-off voltage Voff1 during the first period t1 of the every horizontal period, and is formed with the first gate-on voltage Von1 during the second period t2 thereof. When the initializing transistors IT1, IT2, and IT3 and the test transistor TT1 are formed as p-types, the first gate-on voltage Von1 can have a voltage level that is lower than that of the first gate-off voltage Voff1 as illustrated in FIG. 3. That is, the test control signal TS and the third initialization signal IS3 can have levels that are opposite to each other as illustrated in FIG. 3.

The initialization voltage IV can be set as a peak white gray voltage PWV, and the test voltage TV can be set as a peak black gray voltage PBV. When the driving transistor DT is formed as a P type, the peak white gray voltage PWV can have a voltage level that is lower than that of the peak black gray voltage PBV as illustrated in FIG. 3. Meanwhile, FIG. 3 merely illustrates examples of the initialization voltage IV and the test voltage TV, and thus the initialization voltage IV and the test voltage TV are not limited thereto.

The first to third and $n^{th}$ scanning signals SCAN1, SCAN2, SCAN3, and SCANn can be formed with the second gate-off voltage Voff2 during the first period t1 of the every horizontal period, and can be formed with the second gate-on voltage Von2 within the second period t2 thereof. Although FIG. 3 illustrates the first to third and nth scanning signals SCAN1, SCAN2, SCAN3, and SCANn are formed with the second gate-on voltage Von2 during a period that is shorter than the second period t2 within the second period t2 of the every horizontal period, the present exemplary embodiment is not limited thereto. For example, the first to third and nth scanning signals SCAN1, SCAN2, SCAN3, and SCANn are formed with the second gate-on voltage Von2 during the second period t2 of every horizontal period. When a scan transistor ST is formed as a P-type, the second gate-on voltage Von2 can have a voltage level that is lower than the second gate-off voltage Voff2 as illustrated in FIG. 3.

Meanwhile, when scan transistors ST of the pixels P are designed to have the same transistor characteristics as those of the first to third initializing transistors IT1, IT2, and IT3 and the test transistors TT1, the second gate-on voltage Von2 can have substantially the same voltage level as the first gate-on voltage Von1, and the second gate-off voltage Voff2 can have the same voltage level as the first gate-off voltage Voff1.

Figure 4A:
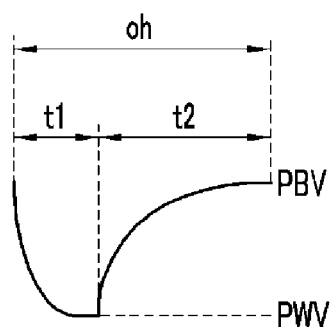
FIGS. 4A, 4B and 4C are waveform diagrams of voltages supplied to pixels during a first period and a second period of FIG. 3.
Figure 4B:
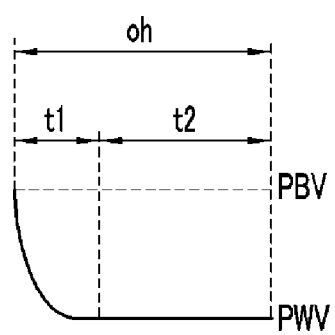
Figure 4C:
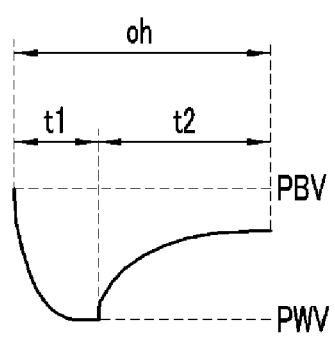

Hereinafter, a crack inspecting method of a display device according to an exemplary embodiment will be described in detail with reference to FIG. 4A to FIG. 4C as well as FIG. 2 and FIG. 3. FIG. 4A to FIG. 4C are waveform diagrams of voltages supplied to pixels during a first period and a second period of FIG. 3.

First, during the first period t1 of the odd-numbered horizontal period oh, the first initialization signal IS1 and the third initialization signal IS3 are formed with the first gate-on voltage Von1. The second initialization signal IS2 and the test control signal TS are formed with the first gate-off voltage Voff1. Accordingly, the, first initializing transistors IT1 and the third initializing transistors IT3 are turned on, and the second initializing transistors IT2 and the test transistors TT1 are turned off. As a result, initialization voltage IV is supplied to the data lines D1a-Dma through the first and third initializing transistors IT1 and IT3.

Next, during the second period t2 of the odd-numbered horizontal period oh, the first to third initialization signals IS1, IS2, and IS3 are formed with the first gate-off voltage Voff1, and the test control signal TS is formed with the first gate-on voltage Von1. Accordingly, the first to third initializing transistors IT1, IT2, and IT3 are turned off, and the test transistors TT1 is turned on. As a result, the test voltage TV is supplied to the data lines D1a-Dma through the test transistors TT1.

Further, when the first scanning signal SCAN1 is formed with the second gate-on voltage Von2 within the second period t2 of the odd-numbered horizontal period oh, voltages of the data lines D1a-Dma are supplied to the pixels RP connected to the first scanning line S1.

In the case where the initialization voltage IV is a peak white gray voltage PWV and the test voltage TV is a peak black gray voltage PBV, the voltage that is to be supplied to the pixel RP is reduced to a peak white gray voltage PWV during the first period t1 and is increased to a peak black gray voltage PBV during the second period t2 as illustrated in FIG. 4A. However, when a crack is generated in the display device, the data lines D1a-Dma or the first to fourth crack sensing lines CD1, CD2, CD11, and CD22 can be disconnected, or wire resistance of the data lines D1a-Dma or the first to fourth crack sensing lines CD1, CD2, CD11, and CD22 can be increased.

For example, when the data lines D1a-Dma or the first to fourth crack sensing lines CD1, CD2, CD11, and CD22 are disconnected due to the crack generated in the display device, no peak black gray voltage PBV during the second period t2, the voltage that is to be supplied to the pixel RP is reduced to the peak white gray voltage PWV during the first period t1 and is maintained to be the peak white gray voltage PWV during the second period t2 as illustrated in FIG. 4B. As a result, since the pixels RP connected to the data line or the crack sensing line that is disconnected due to the crack displays peak white grays, strong bright lines can be viewed.

Further, in the case where the wire resistance of the data lines D1a-Dma or the first to fourth crack sensing lines CD1, CD2, CD11, and CD22 is increased due to the generated in the display device, although the peak black gray voltage PBV is supplied during the second period t2, the voltage that is to be supplied to the pixel RP is reduced to the peak white gray voltage PWV thereof during the first period t1, but is not increased up to the peak black gray voltage PBV during the second period t2, due to an increase in the wire resistance, as illustrated in FIG. 4C. As a result, the pixels RP connected to the data line or the crack sensing line of which the wire resistance is increased due to the generated crack display gray grays, weak bright lines can be viewed.

As described above, according to the present exemplary embodiment, it is possible to determine whether a crack is generated in the display device by use of disconnection of the data lines D1a-Dma or a variation of wire resistance thereof and disconnection of a crack sensing line which is formed outside the display area DA or variation of wire resistance thereof, by supplying the initialization voltage IV through the initializing transistors IT1, IT2, and IT3 during the first period t1 of the every horizontal period and supplying the test voltage TV through the test transistors TT1 during the second period t2 thereof. As a result, when a strong or weak bright line is viewed, it is determined that a crack is generated.

As such, according to the display device according to the present exemplary embodiment, when a crack is generated at a portion of the non-display area NDA formed around the display area DA at which the encapsulation portion EN is formed, a strong or weak bright line is viewed from pixels connected to data lines connected to the first crack sensing line CD1 and the second crack sensing line CD2 which overlap the encapsulation portion EN.

Further, when a crack is generated at an outermost portion of the non-display area NDA formed around the display area DA, damage is applied to the third crack sensing line CD11 and the fourth crack sensing line CD22 formed at the outermost portion of the non-display area NDA formed around the display area DA. Accordingly, a strong or weak bright line is viewed from pixels connected to data lines connected to the third crack sensing line CD11 and the fourth crack sensing line CD22.

As such, according to the display device according to the present exemplary embodiment, it is possible to detect cracks generated from the area in which the encapsulation portion EN is formed as well as the non-display area NDA in which the encapsulation portion EN is not formed.

Figure 5:
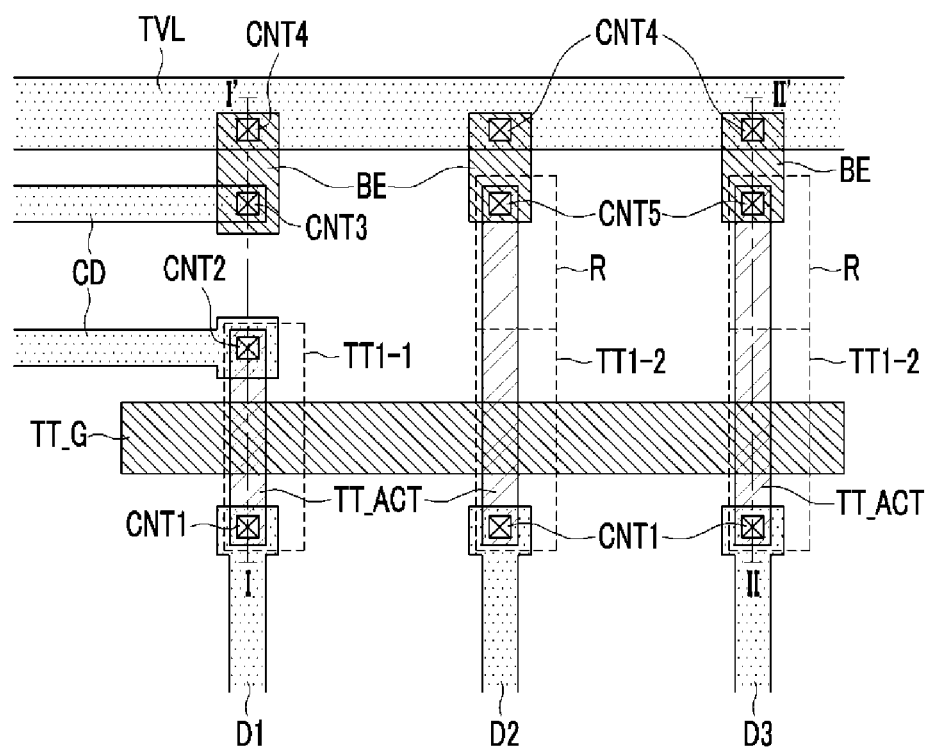
FIG. 5 is a top plan view illustrating a connection structure between a test transistor and a crack sensing line, and between a test transistor and a resistor illustrated in FIG. 3.

Hereinafter, connection structures between a test transistor and a crack sensing line, and the test transistor and a resistor will be described with reference to FIG. 5 to FIG. 7. FIG. 5 is a top plan view illustrating a connection structure between a test transistor and a crack sensing line, and between a test transistor and a resistor illustrated in FIG. 3, FIG. 6 is a cross-sectional view taken along the line I-I' of FIG. 5, and FIG. 7 is a cross-sectional view taken along the line II-II' of FIG. 5.

For the convenience of description, three data lines D1, D2, and D3 and three test transistors TT1 connected thereto are merely illustrated in FIG. 5.

Figure 6:
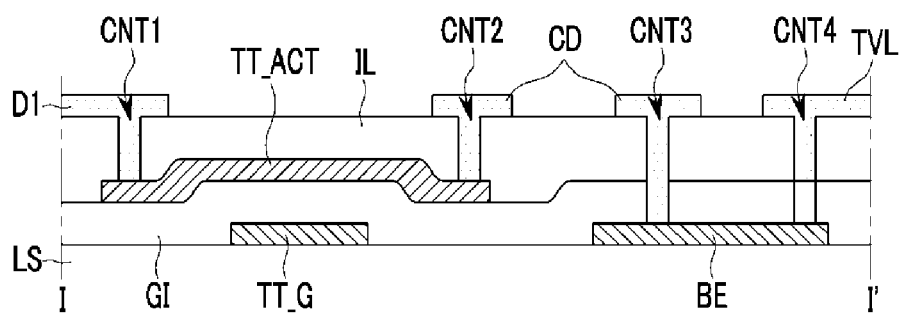
FIG. 6 is a cross-sectional view taken along the line I-I' of FIG. 5.
Figure 7:
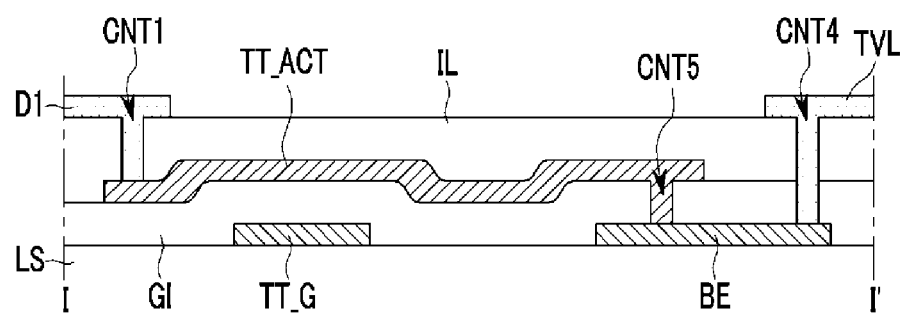
FIG. 7 is a cross-sectional view taken along the line II-II' of FIG. 5.

In FIG. 6, the test transistor TT1 that is connected to the crack sensing line CD is referred to as a first test transistor TT1-1, and the test transistors TT1 that are connected to the resistors R are respectively referred to as second test transistors TT1-2.

Referring to FIG. 5 and FIG. 6, the control electrode TT_G of the first test transistor TT1-1 overlaps the first active layer TT_ACT at a predetermined region. A first end of the first active layer TT_ACT of the first test transistor TT1-1 is connected to the data line D through a first contact hole CNT1, and a second end of the first active layer TT_ACT is connected to a first end of the crack sensing line CD through a second contact hole CNT2. As illustrated in FIG. 2, the crack sensing line CD is formed to travel around the outside of the display area DA. In this case, a second end of the crack sensing line CD is connected to a bridge electrode BE through a third contact hole CNT3. The bridge electrode BE can be connected to a test voltage line TVL through a fourth contact hole CNT4. The test voltage line TVL is a line connected to any one of the test voltage pads TVP1 and TVP2 to which the test voltage TV is supplied.

The bridge electrode BE and the control electrode TT_G of the first test transistor TT1-1 can be formed in a first pattern, the first active layer TT_ACT of the first test transistor TT1-1 can be formed in a semiconductor pattern, and the data line D1 and the test voltage line TVL can be formed in a second metal pattern. Herein, the first metal pattern can be a gate metal pattern, and the second metal pattern can be a source/drain metal pattern. The semiconductor pattern can be formed of a poly-silicon, but the present exemplary embodiment is not limited thereto. For example, the semiconductor pattern is formed of a single-crystalline silicon, an amorphous silicon, or an oxide semiconductor material. A gate insulating layer G1 can be formed between the first metal pattern and the semiconductor pattern to insulate the first metal pattern and the semiconductor pattern from each other. Further, an insulating layer IL can be formed between the semiconductor pattern and the second metal pattern to insulate the semiconductor pattern and the second metal pattern from each other. In the illustrated exemplary embodiment, the crack sensing lines CD have been described to be formed on the same layer as that of the data line D1 and the test voltage line TVL. However, according to another exemplary embodiment, the first crack sensing line CD1 and second crack sensing line CD2 can be formed on the same layer as that of the touch wires formed at the touch portion TM, and the third crack sensing line CD11 and fourth crack sensing line CD22 can be formed on the same layer as that of portions of the signal lines, e.g., gate wires or data wires, formed in the display area DA.

Referring to FIG. 5 and FIG. 7, the control electrode TT_G of the second test transistor TT1-2 overlaps the first active layer TT_ACT at a predetermined region. A first end of the first active layer TT_ACT of the second test transistor TT1-2 is connected to any one of two data lines D2 and D3 through the first contact hole CNT1, and a second end of the first active layer TT_ACT is connected to the bridge electrode BE through the fifth contact hole CNT5. The bridge electrode BE can be connected to the test voltage line TVL through the fourth contact hole CNT4.

The bridge electrode BE and the control electrode TT_G of the second test transistor TT1-2 can be formed in a first metal pattern, the first active layer TT_ACT of the second test transistor TT1-2 can be formed in a semiconductor pattern, and the two data lines D2 and D3 and the test voltage line TVL can be formed in a second metal pattern. Herein, the first metal pattern can be a gate metal pattern, and the second metal pattern can be a source/drain metal pattern. The semiconductor pattern can be formed of a poly-silicon, but the present exemplary embodiment is not limited thereto. For example, the semiconductor pattern is formed of a single-crystalline silicon, an amorphous silicon, or an oxide semiconductor material. A gate insulating layer G1 can be formed between the first metal pattern and the semiconductor pattern to insulating the first metal pattern and the semiconductor pattern from each other. Further, an insulating layer IL can be formed between the semiconductor pattern and the second metal pattern to insulate the semiconductor pattern and the second metal pattern from each other.

Meanwhile, the first active layer TT_ACT of the second test transistor TT1-2 is formed to be longer than the first active layer TT_ACT of the first test transistor TT1-1. For example, the first active layer TT_ACT of the second test transistor TT1-2 formed to be longer than the first active layer TT_ACT of the first test transistor TT1-1 serves as a resistor R. For example, the first active layer TT_ACT of the first test transistor TT1-1, which is doped with impurities, functions as a resistor R. In this case, it is possible to minimize a deviation of the test voltage caused by the wire resistance of the crack sensing line CD by designing the resistance of resistor R to be substantially the same as the wire resistance of the crack sensing line CD.

Figure 8:
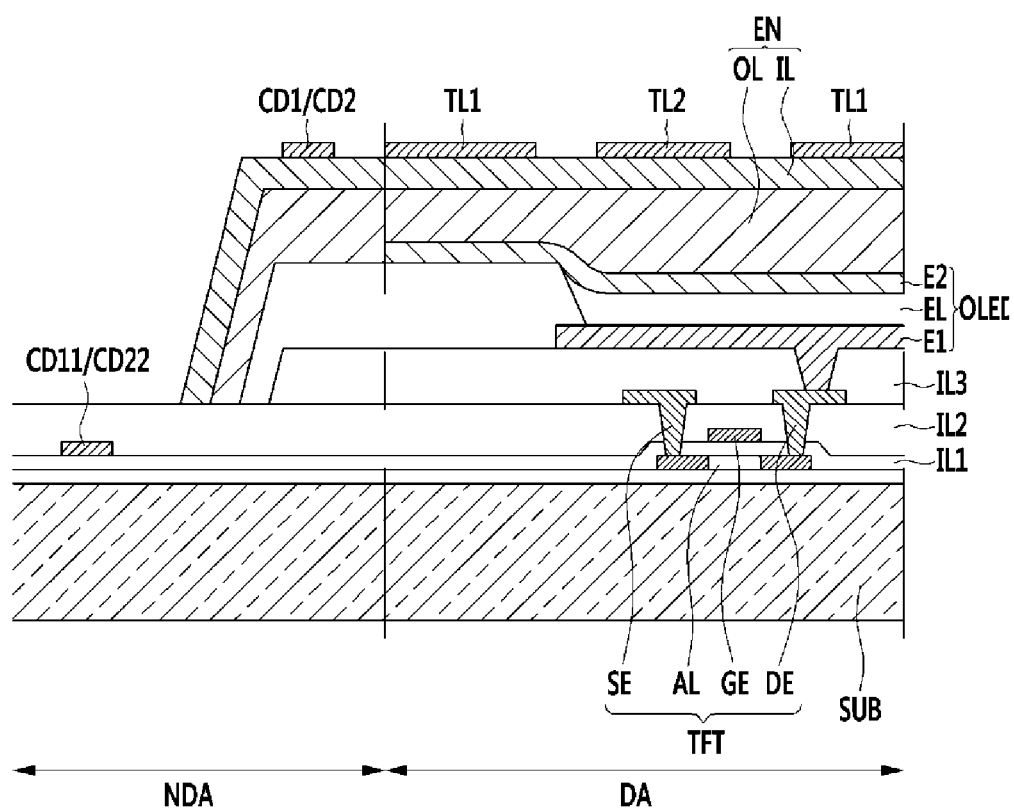
FIG. 8 is a cross-sectional view partially illustrating the display device illustrated in FIG. 2.

Hereinafter, a layer structure of the display device according to an exemplary embodiment will be described with reference to FIG. 8 in addition to FIG. 1 and FIG. 2. FIG. 8 is a cross-sectional view partially illustrating the display device illustrated in FIG. 2.

Referring to FIG. 8 as well as FIG. 1 and FIG. 2, each pixel of the display area DA includes an organic light-emitting diode (OLED) and a thin film transistor (TFT) connected thereto.

The TFT includes a second active layer AL, a gate electrode GE, a source electrode SE, and a drain electrode DE.

The second active layer AL can be formed of a polysilicon or an oxide semiconductor. The oxide semiconductor can include any one of an oxide such as Titanium (Ti), hafnium (Hf), zirconium (Zr), aluminum (AL), tantalum (Ta), germanium GE, zinc (Zn), gallium (Ga), tin (Sn) or indium (In), a compound oxide such as a zinc oxide (ZnO), an indium-gallium-zinc oxide (InGaZnO4), an indium-zinc oxide (Zn—In—O), an zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), and a hafnium-indium-zinc oxide (Hf—In—Zn—O).

The second active layer AL includes a channel area that is not doped with impurities, and a source area and a drain area that are formed on opposite sides of the channel area by being doped with impurities. Herein, these impurities can be varied according to types of the thin film transistor, and can include N-type or P-type impurities. When the second active layer AL is formed of an oxide semiconductor, an additional passivation layer can be formed to protect the oxide semiconductor which is vulnerable to the environment including high-temperature disposure.

The gate electrode GE is formed on the second active layer AL with a first insulating layer IL1, and the source electrode SE and the drain electrode DE are formed on the second insulating layer IL2 which covers the gate electrode GE, to be respectively connected to the source area and the drain area of the second active layer AL through contact holes formed in the second insulating layer IL2. The drain electrode DE is connected to a first electrode E1 of the OLED through a contact hole.

The OLED includes a first electrode E1 connected to a drain electrode DE of the TFT, an organic emission layer EL formed on the first electrode E1, and a second electrode E2 formed on the organic emission layer EL.

The first electrode E1 can be an anode serving as a hole injection electrode, and can be any one of a light reflective electrode, a light transflective electrode, and a transmissive electrode. Meanwhile, according to another exemplary embodiment, the first electrode E1 can be a cathode serving as an electron injection electrode.

The organic emission layer EL is formed on the first electrode E1. The organic emission layer EL can be formed of a low-molecular organic material or a high-molecular organic material such as poly(3,4-ethylenedioxythiophene) (PEDOT). Further, the organic emission layer EL can include at least one of a red organic emission layer for emitting red light, a green organic emission layer for emitting green light, and a blue organic emission layer for emitting blue light. The red organic emission layer, the green organic emission layer, and the blue organic emission layer are respectively formed in a red pixel, a green pixel, and a blue pixel to implement a color image. The organic emission layer EL can implement the color image by laminating the red organic emission layer, the green organic emission layer, and the blue organic emission layer together in the red pixel, the green pixel, and the blue pixel, and forming a red color filter, a green color filter, and a blue color filter for each pixel. As another example, white organic emission layers emitting white light are formed in all of the red pixel, the green pixel, and the blue pixel, and a red color filter, a green color filter, and a blue color filter are formed for each pixel, thereby implementing the color image. In the case of implementing the color image by using the white organic emission layer and the color filters as the organic emission layer EL, a deposition mask for depositing the red organic emission layer, the green organic emission layer, and the blue organic emission layer on respective pixels, that is, the red pixel, the green pixel, and the blue pixel, does not need to be used. The white organic emission layer described in another example can be formed by one organic emission layer, and includes a configuration formed so as to emit white light by laminating a plurality of organic emission layers. For example, the white organic emission layer includes a configuration which emits white light by combining at least one yellow organic emission layer and at least one blue light emitting layer, a configuration which emits white light by combining at least one cyan organic emission layer and at least one red light emitting layer, a configuration which emits white light by combining at least one magenta organic emission layer and at least one green light emitting layer, and the like.

The second electrode E2 is formed on the organic emission layer EL, and can be a cathode serving as an electron injection electrode. The second electrode E2 can be any one of a light reflective electrode, a light transflective electrode, and a transmissive electrode. The second electrode E2 is formed throughout the display area DA of the substrate SUB so as to cover the organic emission layer EL. In another exemplary embodiment, the second electrode E2 is an anode serving as a hole injection electrode.

The encapsulation portion EN is formed on the substrate SUB through the display area DA and the non-display area NDA, and encapsulates the display area DA together with the substrate SUB. The encapsulation portion EN includes an organic layer IL formed on the display area DA and an inorganic layer IL formed on the organic layer OL.

The organic layer OL is formed of a polymer, and can be a single layer or a stacked layer formed of any one of, for example, polyethylene terephthalate, a polyimide, a polycarbonate, an epoxy, a polyethylene, and a polyacrylate. For example, the organic layer OL is formed of polyacrylate, for example, a material produced by polymerizing a monomer component including a diacrylate-based monomer and a triacrylate-based monomer. Herein, a monoacrylate-based monomer can be further included in the monomer component, and a photoinitiator, such as TPO, can be further included in the monomer component, but the described technology is not limited thereto.

The inorganic layer IL can be a monolayer or a multilayer formed of a metal oxide or a metal nitride. For example, the inorganic layer IL is formed of any one of SiNx, $Al_2O_3$, $SiO_2$, and $TiO_2$.

The inorganic layer IL, which is the uppermost layer of the encapsulation portion EN is layered with a wider area compared to the organic layer OL so as to cover ends of the organic layer OL which is another layer. For example, the inorganic layer IL covers the end of the organic layer OL in the non-display area NDA of the substrate SUB. That is, an upper inorganic layer layered at an area wider than those of other layers can be formed on the uppermost layer of the encapsulation portion EN so as to cover ends of other layers. Accordingly, external moisture permeation into the OLED can be suppressed by the inorganic layer IL.

The touch portion TM includes a first touch line TL1 and a second touch line TLs formed on the encapsulation portion EN corresponding to the display area DA of the substrate SUB. When the touch portion TM is touched while the touch portion TM can be a capacitive type, and the voltages are respectively applied to the first touch line TL1 and the second touch line TL2 and thus charges are charged in each of the first and second touch lines TL1 and TL2 or between the first and second touch lines TL1 and TL2, capacitance of the touch portion, which is one of the first touch line TL1 and the second touch line TL2, is changed so as to detect a location of the touch portion. The touch portion TM can further include one or more insulating layers covering the first touch line TL1 and the second touch line TL2. Each of the first touch line TL1 and the second touch line TL2 can be formed of one or more of a transparent conductive material such as ITO, IZO, IGZO, etc., a metal mesh patterned in a mesh form, a conductive polymer such as poly(3,4-ethylenedioxythiophene) (PEDOT), etc., a nano-sized conductive material such as a silver nanowire (AGNW), etc., and the like.

The first crack sensing line CD1 and the second crack sensing line CD2 are formed at an edge of the inorganic layer IL formed on the uppermost layer of the encapsulation portion EN. In this case, the first crack sensing line CD1 and the second crack sensing line CD2 are formed on the same layer as those of the first touch line TL1 and the second touch line TL2. The first crack sensing line CD1 and the second crack sensing line CD2 can be formed in the non-display area NDA which is adjacent to the display area DA, and can be formed on the encapsulation portion EN.

The third crack sensing line CD11 and the fourth crack sensing line CD22 are formed at an outermost portion of the non-display area NDA at which the encapsulation portion EN is not formed. The third crack sensing line CD11 and the fourth crack sensing line CD22 can be formed on the same layer as that of the gate electrode GE of the display area DA.

Figure 9:
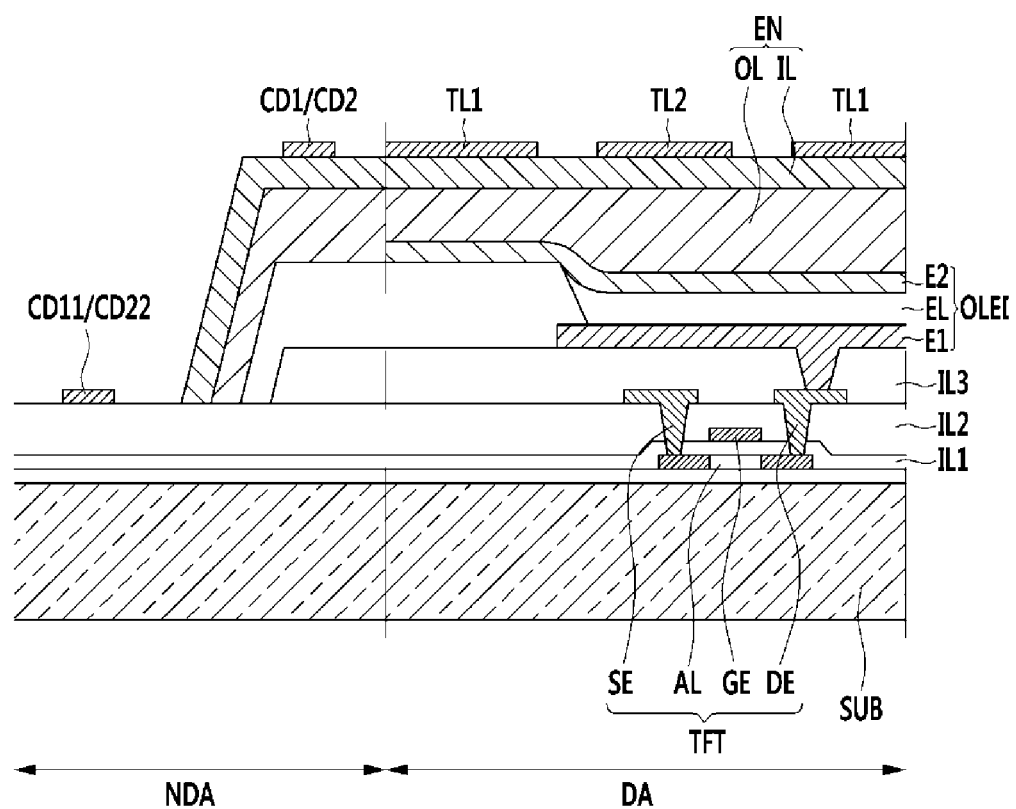
FIG. 9 is a cross-sectional view partially illustrating the display device illustrated in FIG. 2 according to another exemplary embodiment.

Hereinafter, a display device according to an exemplary embodiment will be described with reference to FIG. 9. FIG. 9 is a cross-sectional view partially illustrating the display device illustrated in FIG. 2 according to another exemplary embodiment. Referring to FIG. 1, FIG. 2, and FIG. 9, each pixel of the display area DA includes an OLED emitting light and a TFT connected with the OLED.

The TFT includes a second active layer AL, a gate electrode GE, a source electrode SE, and a drain electrode DE.

The OLED includes a first electrode E1 connected with the drain electrode DE of the TFT, an organic emission layer EL formed on the first electrode E1, and a second electrode E2 formed on the organic emission layer EL.

The encapsulation portion EN is formed on the substrate SUB through the display area DA and the non-display area NDA, and encapsulates the display area DA together with the substrate SUB. The encapsulation portion EN includes an organic layer IL formed on the display area DA and an inorganic layer IL formed on the organic layer OL.

The touch portion TM includes a first touch line TL1 and a second touch line TLs formed on the encapsulation portion EN corresponding to the display area DA of the substrate SUB.

The first crack sensing line CD1 and the second crack sensing line CD2 are formed at an edge of the inorganic layer IL formed on the uppermost layer of the encapsulation portion EN. In this case, the first crack sensing line CD1 and the second crack sensing line CD2 are formed on the same layer as those of the first touch line TL1 and the second touch line TL2. The first crack sensing line CD1 and the second crack sensing line CD2 can be formed in the non-display area NDA which is adjacent to the display area DA, and can be formed on the encapsulation portion EN.

The third crack sensing line CD11 and the fourth crack sensing line CD22 are formed at an outermost portion of the non-display area NDA at which the encapsulation portion EN is not formed. The third crack sensing line CD11 and the fourth crack sensing line CD22 are formed on the same layer as those of the source electrode SE and the drain electrode DE of the display area DA and the data line D.

According to at least one of the disclosed embodiments, the third crack sensing line CD11 and the fourth crack sensing line CD22 have been described to be formed on the same layer as that of the gate electrode GE of the display area DA or that of the source electrode SE and the drain electrode DE thereof and the data line D. However, according to a display device of another exemplary embodiment, the third crack sensing line CD11 and the fourth crack sensing line CD22 can be formed to include a plurality of layers including a first layer formed on the same layer as that of the gate electrode GE of the display area DA and a second layer formed on the same layer as that of the source electrode SE and the drain electrode DE thereof and the data line D.

In the aforementioned exemplary embodiments, an OLED display has been described as an example of the display device, but many characteristics of the aforementioned exemplary embodiments are applicable to various display devices such as liquid crystal displays (LCDs) each of which includes a display area for displaying images and a touch portion for recognizing touches, plasma displays (PDs), field emission displays (FEDs), electrophoretic displays (EPDs), and electrowetting displays (EWDs).

While the inventive technology has been described with reference to the figures, it will be understood by those of ordinary skill in the art that various changes in form and details can be made therein without departing from the spirit and scope as defined by the following claims.

What is claimed is:
1. A display device, comprising:
   a substrate including a display area and a non-display area surrounding the display area;
   a plurality of pixels disposed in the display area;
   a plurality of signal lines disposed over the substrate and electrically connected to the pixels;
   an encapsulation layer disposed over the substrate; and
   a first crack sensing line disposed on the encapsulation layer in the non-display area, wherein the signal lines include a gate line and a data line, and the first crack sensing line is electrically connected to the data line.

2. The display device of claim 1, wherein the first crack sensing, line overlaps the encapsulation layer in a depth dimension of the display device.

3. The display device of claim 2, further comprising:
a second crack sensing line disposed under the encapsulation layer in the non-display area.

4. The display device of claim 2, further comprising:
a touch layer including a touch wire disposed over the encapsulation layer,
wherein the first crack sensing line is disposed on the same layer as the touch wire of the touch layer.

5. The display device of claim 2, further comprising:
a third crack sensing line in the non-display area and not overlapping the encapsulation layer in the depth dimension of the display device.

6. The display device of claim 5, wherein the third crack sensing line is disposed on the same layer as the gate line.

7. The display device of claim 1, further comprising:
a second crack sensing line disposed under the encapsulation layer in the non-display area.

8. The display device of claim 1, further comprising:
a touch layer including a touch wire disposed over the encapsulation layer,
wherein the first crack sensing line is disposed on the same layer as the touch wire of the touch layer.

9. The display device of claim 1, further comprising:
a third crack sensing line in the non-display area and not overlapping the encapsulation layer in a depth dimension of the display device.

10. The display device of claim 9, wherein the third crack sensing line is disposed on the same layer as the gate line.

11. The display device of claim 1, wherein the signal lines further include a first signal line and a second signal line in the non-display area,
wherein the data line is electrically connected to the first signal line via a first transistor and the second signal line via a second transistor.

12. The display device of claim 11, wherein the first crack sensing line is electrically connected to the second signal line and the second transistor.

13. The display device of claim 12, further comprising:
a first gate line disposed in the non-display area and electrically connected to the first transistor; and
a second gate line electrically connected to the second transistor,
wherein the data line receives a first signal from the first signal line according to a first gate-on voltage applied to the first gate line, and
wherein the data line receives a second signal from the second signal line according to a second gate-on voltage applied to the second gate line.

14. The display device of claim 13, wherein the second gate-on voltage is applied after the first gate-on voltage is applied, and wherein the first signal and the second signal are different.

* * * * *